United States Patent
Blagrave et al.

(10) Patent No.: US 10,794,742 B2
(45) Date of Patent: Oct. 6, 2020

(54) HOT WIRE FLUID LEVEL OR FLOW SENSOR HAVING A CONDUCTIVE MATERIAL IN THE FLUID

(71) Applicant: DELPHI TECHNOLOGIES IP LIMITED, St. Michael (BB)

(72) Inventors: James J. Blagrave, Noblesville, IN (US); Brian J. Smith, Kokomo, IN (US)

(73) Assignee: DELPHI TECHNOLOGIES IP LIMITED (BB)

( * ) Notice: Subject to any disclaimer, the term of this patent is extended or adjusted under 35 U.S.C. 154(b) by 0 days.

(21) Appl. No.: 16/248,953

(22) Filed: Jan. 16, 2019

(65) Prior Publication Data
US 2020/0225069 A1 Jul. 16, 2020

(51) Int. Cl.
*G01F 1/64* (2006.01)
*G01F 23/24* (2006.01)
*H03K 17/687* (2006.01)

(52) U.S. Cl.
CPC ............... *G01F 1/64* (2013.01); *G01F 23/24* (2013.01); *H03K 17/687* (2013.01)

(58) Field of Classification Search
None
See application file for complete search history.

(56) References Cited

U.S. PATENT DOCUMENTS

| | | |
|---|---|---|
| 3,464,269 A | 9/1969 | Froger |
| 4,458,529 A | 7/1984 | Nagaishi et al. |
| 4,525,850 A | 6/1985 | Miller |
| 4,609,913 A | 9/1986 | Arbogast et al. |
| 4,672,842 A | 6/1987 | Hasselmann |
| 4,756,076 A | 7/1988 | Dyben et al. |
| 4,934,189 A | 6/1990 | Tanimoto et al. |
| 4,987,776 A * | 1/1991 | Koon ............... G01F 23/265 340/612 |
| 5,438,866 A | 8/1995 | McQueen |
| 6,840,116 B2 | 1/2005 | Higgins |
| 7,013,725 B1 | 3/2006 | Hagan et al. |
| 7,205,781 B2 | 4/2007 | Maslovich |
| 2007/0229416 A1 | 10/2007 | De Oto |
| 2018/0023992 A1* | 1/2018 | Bian ............... G01F 23/265 |

* cited by examiner

*Primary Examiner* — Harshad R Patel
(74) *Attorney, Agent, or Firm* — Joshua M. Haines

(57) ABSTRACT

A fluid sensing system includes a sensing element having a positive temperature coefficient of resistance. The system also includes a switch which is switchable between an open position which prevents current from passing and a closed position which permits current to pass. An inductor is connected electrically in series between the switch electric output and the sensing element and a diode is connected electrically in series between the sensing element and the inductor such that an output of the diode is between the switch and the inductor. A hysteretic controller changes the switch from the open position to the closed position when current passing to the sensing element falls to a lower current threshold and changes the switch from the closed position to the open position when current passing to the sensing element rises to an upper current threshold. A voltmeter measures voltage across the sensing element.

12 Claims, 4 Drawing Sheets

HOT WIRE FLUID LEVEL OR FLOW SENSOR HAVING A CONDUCTIVE MATERIAL IN THE FLUID

TECHNICAL FIELD OF INVENTION

The present invention relates to a hot wire fluid sensor which measures either fluid level or fluid flow of a fluid and the present invention also relates to a method of using the hot wire fluid sensor.

BACKGROUND OF INVENTION

Hot wire sensors are used, for example, to measure fluid level very precisely or to measure fluid flow. Hot wire sensors that are used to measure fluid level operate on the principle that a conductive material can dissipate heat more easily when submerged in a liquid having a specific heat that is lower than the specific heat of air than compared to when the conductive material is exposed to air. Hot wire sensors that are used to measure fluid flow operate on the principle that a conductive material can dissipate heat more easily as the flow rate of the fluid increases. In either case, the conductive material of the hot wire sensor has a positive temperature coefficient of resistance, and consequently, as electrical energy is applied to the conductive material, the conductive material increases in temperature and as the temperature of the conductive material increases, the resistance of the conductive material also increases. For measuring fluid level, the conductive material is disposed within a container which contains fluid of which the fluid level is desired to be measured such that the portion of the conductive material that is submersed in the fluid varies based on the fluid level in the container. As an increasing portion of the conductive material is submerged into the fluid with a lower specific heat than air, the positive temperature coefficient of resistance of the conductive material decreases in absolute value. Consequently, the further the conductive material is submerged into the fluid, i.e. greater magnitude of fluid level, the less its resistance changes when electrical energy is applied thereto in the form of current or voltage. Conversely, the less the conductive material is submerged into the fluid, i.e. lesser magnitude of fluid level, the greater its resistance changes when electrical energy is applied thereto. In order to determine the fluid level of the fluid in the container, resistance of the conductive material is measured as soon as constant electrical stimulus is applied to the conductive material and then the resistance of the conductive material is measured again after the electrical stimulus has been applied for a predetermined length of time. The change in resistance between the initial resistance measurement and the final resistance is then characterized to determine how far the sensor is submerged into the fluid. In order to measure the resistance of the conductive material, either 1) a constant current is sent through the conductive material and the voltage across the conductive material is measured or 2) a constant voltage is applied across the conductive material and the current through the conductive material is measured. However, the most common implementation of the hot wire sensor is the current-controlled configuration where a known current is supplied to the conductive material for a predetermined length of time and the voltage across the sensor is measured at the beginning of the application of electric current to the conductive material and at the end of the predetermined length of time. This method requires that the current be very precise and must be held constant in order to measure the voltage. A comparable approach may be used for measuring fluid flow; however, the conductive material is always submersed uniformly, and preferably, is entirely submersed in the fluid or the depth of the fluid is used to take into account for flow variations due to varying depths of the fluid. Furthermore, the change in resistance between the initial resistance measurement and the final resistance is then characterized to determine the flow rate of the fluid.

FIG. 1 illustrates a fluid sensing system 10, by way of electrical schematic, in an implementation for sensing fluid level. Fluid sensing system 10 includes a sensing element 12, i.e. hot wire, which is disposed within a container 14 which contains a fluid 16, for example oil in an oil pan of an internal combustion engine (not shown) where the oil is used to lubricate the operating components of the internal combustion engine. Sensing element 12 is positioned within container 14 such that the extent to which sensing element 12 is submerged within fluid 16 is dependent upon the fluid level of fluid 16 in container 14. Consequently, the extent that sensing element 12 is exposed to a volume of air 18 above fluid 16 is also dependent upon the fluid level of fluid 16 in container 14. Sensing element 12 is a conductive material which has a positive temperature coefficient of resistance and which may be, by way of non-limiting example only, tungsten, platinum, platinum-rhodium, or platinum-iridium. Consequently, as electrical energy is applied to sensing element 12, sensing element 12 increases in temperature, thereby also increasing the resistance of sensing element 12. An electricity source, illustrated herein as battery 20 and a linear current supply 22, is provided such that linear current supply 22 is electrically connected in series between a positive terminal 20a (of battery 20) and sensing element 12 and such that sensing element 12 is electrically connected in series between linear current supply 22 and ground 24. A negative terminal 20b of battery 20 is also connected to ground 24. Battery 20 may be, by way of non-limiting example, a 24V battery which supplies electricity to linear current supply 22. Linear current supply 22 conditions the electricity from battery 20 to be a desired voltage, for example typically between 1V and 5V, and to be of a constant current, for example typically 250 mA, which is supplied to sensing element 12 as illustrated by the arrow labeled "SENSE CURRENT" in FIG. 1. In order to measure the voltage across sensing element 12, a voltmeter 26 is provided such that voltmeter 26 is electrically connected at a first measurement junction 28 between linear current supply 22 and sensing element 12 and is also electrically connected at a second measurement junction 30 between sensing element 12 and ground 24. Voltmeter 26 produces a voltage signal 32 which is communicated to an electric processor 34 which is configured to calculate the resistance of sensing element 12 based on the equation:

$$R = \frac{V}{I};$$

where R is the resistance of sensing element 12, V is the voltage measured by voltmeter 26, and I is the current supplied by linear current supply 22. The difference between a first resistance value and a second resistance value is calculated by electronic processor 34 and characterized to a fluid level where the first resistance value is calculated as soon as linear current supply 22 applies the constant current to sensing element 12 and where the second resistance value is calculated after a predetermined length of time that the current is applied to sensing element 12. The predetermined length of time may be, for example, the length of time necessary to produce a desired change in temperature of sensing element 12. Furthermore, electronic processor 34 may characterize the fluid level from the difference between the first resistance value and the second resistance value by using a stored lookup table which may be determined, by way of non-limiting example, through empirical testing.

The power dissipated by linear current supply 22 is provided by the following equation:

$$P=I[V-(IR)]$$

where P is the power dissipated by current supply 22, I is the current supplied by linear current supply 22, V is the voltage of battery 20 and R is the resistance of sensing element 12. In a typical example, I is 250 mA, V is 24V, and R is 5Ω. Using these exemplary values, the power dissipated by linear current supply 22 is greater than 5 W to provide 250 mA to sensing element 12.

FIG. 2 provides four graphs for a period of time from $T_1$ to $T_2$ which represents the predetermined time period needed for determining the fluid level in container 14. In FIG. 2, plot 36 represents the power dissipated by linear current supply 22, plot 38 represents the voltage output of linear current supply 22, plot 40 represents the current supplied to sensing element 12, and plot 42 represents the voltage across sensing element 12. As can be seen by plot 36, power is dissipated by linear current supply 22 for the entire duration from $T_1$ to $T_2$ in order to provide the constant current as shown by plot 40.

Fluid sensing system 10 and the method of using fluid sensing system 10 requires expensive amplifiers and sense resistors in order to achieve the necessary accuracy to measure the fluid level. Additionally, fluid sensing system 10 and the method of using fluid sensing system 10 results in a large packaging requirement due to a heat sink that is required to accommodate the large power dissipation for linear current supply 22.

What is needed is a fluid sensing system which minimizes or eliminates one or more of the shortcomings as set forth above.

SUMMARY OF THE INVENTION

Briefly described, a fluid sensing system is provided by the present invention for sensing a fluid depth or a fluid flow of a fluid. The fluid sensing system includes a sensing element configured to be disposed in the fluid, the sensing element having a positive temperature coefficient of resistance, and the sensing element including a sensing element electric input and a sensing element electric output; a switch including a switch electric input and a switch electric output, the switch being switchable between an open position which prevents electric current from passing from the switch electric input to the switch electric output and a closed position which permits electric current to pass from the switch electric input to the switch electric output; an inductor connected electrically in series between the switch electric output and the sensing element, the inductor including an inductor electric input and an inductor electric output; a diode connected electrically in series between the sensing element and the inductor, the diode including a diode electric input and a diode electric output such that the diode electric output is electrically connected between the switch electric output and the inductor electric input; a hysteretic controller configured to change the switch from the open position to the closed position when electric current passing to the sensing element falls to a lower current threshold and configured to change the switch from the closed position to the open position when electric current passing to the sensing element rises to an upper current threshold; and a means for measuring voltage across the sensing element. The present invention also provides a method for sensing a fluid depth or a fluid flow of a fluid using the fluid sensing system. The method includes i) using the hysteretic controller to close the switch which allows an electric current to flow to the inductor and the sensing element; ii)) after step i), using the hysteretic controller to open the switch when the electric current reaches a upper current threshold; iii) after step ii), recirculating the electric current through the diode to the inductor and the sensing element while the switch is open; iv) after step iii), using the hysteretic controller to close the switch when the step of recirculating the electric current causes the electric current to decay to a lower current threshold; v) repeating step i)-iv) for a predetermined time; vi) prior to step v), using the means for measuring voltage across the sensing element to measure a first voltage across the sensing element when the electric current is one of the lower current threshold and the upper current threshold; vii) after step v) and after step vi), using the means for measuring voltage across the sensing element to measure a second voltage across the sensing element when the electric current is the one of the lower current threshold and the upper current threshold; and viii) using the first voltage and the second voltage to characterize the fluid depth or the fluid flow.

The fluid sensing system and method provided herein allows for cost savings and space savings since the hysteretic controller does not require heat sinking, power sense resistors, or precision amplifiers which are needed by linear current supplies used in known fluid sensing systems and related methods.

Further features and advantages of the invention will appear more clearly on a reading of the following detailed description of the preferred embodiment of the invention, which is given by way of non-limiting example only and with reference to the accompanying drawings.

BRIEF DESCRIPTION OF DRAWINGS

This invention will be further described with reference to the accompanying drawings in which.

DETAILED DESCRIPTION OF INVENTION

Figure 3:
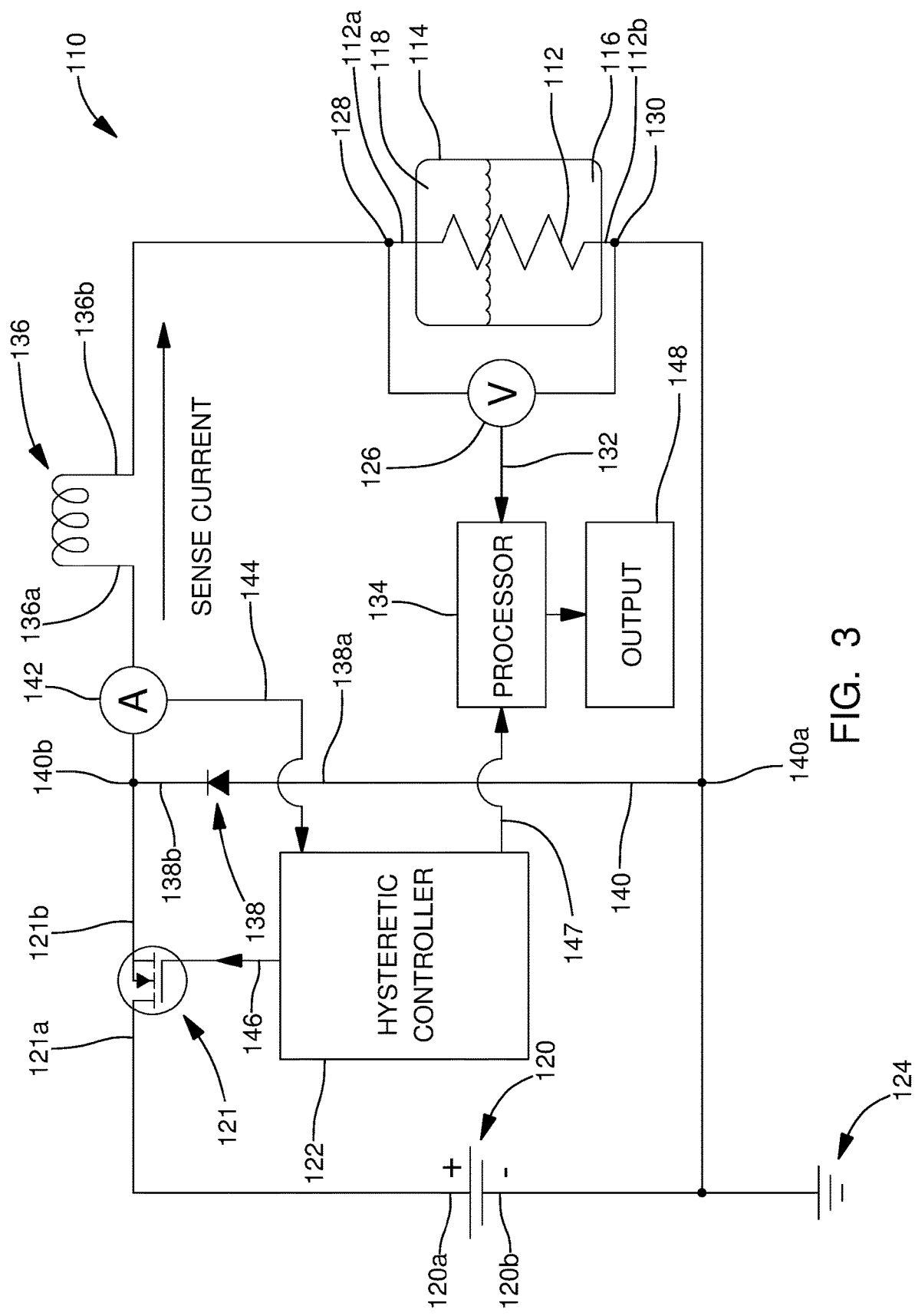
FIG. 3 is a schematic view of a fluid sensing system in accordance with the present invention.

In accordance with a preferred embodiment of this invention and now referring to FIG. 3, a fluid sensing system 110 is illustrated where fluid sensing system 110 is used for one of sensing fluid level or fluid flow. As illustrated herein, by way of non-limiting example only, fluid sensing system 110 is embodied as sensing fluid level. Fluid sensing system 110 includes a sensing element 112, i.e. hot wire, which is disposed within a container 114 which contains a fluid 116, for example oil in an oil pan of an internal combustion engine (not shown) where the oil is used to lubricate the operating components of the internal combustion engine. Sensing element 112 includes a sensing element electric input 112*a* and a sensing element electric output 112*b* and is positioned within container 114 such that the extent to which sensing element 112 is submerged within fluid 116 is dependent upon the fluid level of fluid 116 in container 114. Consequently, the extent sensing element 112 is exposed to a volume of air 118 above fluid 116 is also dependent upon the fluid level of fluid 116 in container 114. Sensing element 112 is a conductive material which has a positive temperature coefficient of resistance and which may be, by way of non-limiting example only, tungsten, platinum, platinum-rhodium, or platinum-iridium. Consequently, as electrical energy is applied to sensing element 112, sensing element 112 increases in temperature, thereby also increasing the resistance of sensing element 112.

An electricity source, illustrated herein as battery 120, a switch 121, and a hysteretic controller 122, such as the DiFlex IC available from Delphi Technologies, is provided such that switch 121 is electrically connected in series between a positive terminal 120*a* (of battery 120) and sensing element 112 and such that sensing element 112 is electrically connected in series between switch 121 and ground 124. A negative terminal 120*b* of battery 120 is also connected to ground 124. Battery 120 may be, by way of non-limiting example, a 24V battery. Switch 121 may be, by way of non-limiting example only, a MOSFET (as illustrated) or an IGBT and includes a switch electric input 121*a* and a switch electric output 121*b* such that switch electric input 121*a* is electrically connected in series (when switch 121 is closed) between positive terminal 120*a* and switch electric output 121*b* and such that switch electric output 121*b* is electrically connected in series (when switch 121 is closed) between switch electric input 121*a* and sensing element 112. Switch 121 is switchable, by hysteretic controller 122, between an open position which prevents electric current from passing from switch electric input 121*a* to switch electric output 121*b* and a closed position which permits electric current to flow from switch electric input 121*a* to switch electric output 121*b*.

In order to measure the voltage across sensing element 112, means for measuring voltage, illustrated as a voltmeter 126, is provided such that voltmeter 126 is electrically connected at a first measurement junction 128 between switch 121 and sensing element electric input 112*a* and is also electrically connected at a second measurement junction 130 between sensing element electric output 112*b* and ground 124. Voltmeter 126 produces a voltage signal 132 which is communicated to an electronic processor 134 which is configured to calculate the resistance of sensing element 112 based on the equation:

$$R = \frac{V}{I};$$

where R is the resistance of sensing element 112, V is the voltage measured by voltmeter 126, and I is the current supplied to sensing element 112. While electronic processor 134 has been illustrated separate from hysteretic controller 122, it should be understood that electronic processor 134 may be integrated with hysteretic controller 122.

An inductor 136 having an inductor electric input 136*a* and an inductor electric output 136*b* is connected electrically in series between switch electric output 121*b* and sensing element electric input 112*a*. Additionally, a diode 138 having a diode electric input 138*a* and a diode electric output 138*b* is connected electrically in series between sensing element electric output 112*b* and inductor electric input 136*a* such that diode electric output 138*b* is electrically connected between switch electric output 121*b* and inductor electric input 136*a*. In this way, diode 138 is provided in a recirculation path 140 which initiates at a first recirculation path junction 140*a* which is between sensing element electric output 112*b* and ground 124. Recirculation path 140 then continues through diode 138 and then to a second recirculation path junction 140*b* which is between switch electric output 121*b* and diode 138.

In order to provide feedback of the current being supplied to sensing element 112, a current sensor 142 is provided between second recirculation path junction 140*b* and sensing element 112. This placement of current sensor 142 allows the current being supplied to sensing element 112 to be detected whether the current is coming from battery 120 or whether the current is coming from recirculation path 140. Current sensor 142 produces a current signal 144 which is supplied to hysteretic controller 122 and used by hysteretic controller 122 to maintain the current supplied to sensing element 112 between a lower current threshold $I_L$ and an upper current threshold $I_U$ during a measurement period by opening and closing switch 121 via a switching signal 146 sent to hysteretic controller 122.

Figure 4:
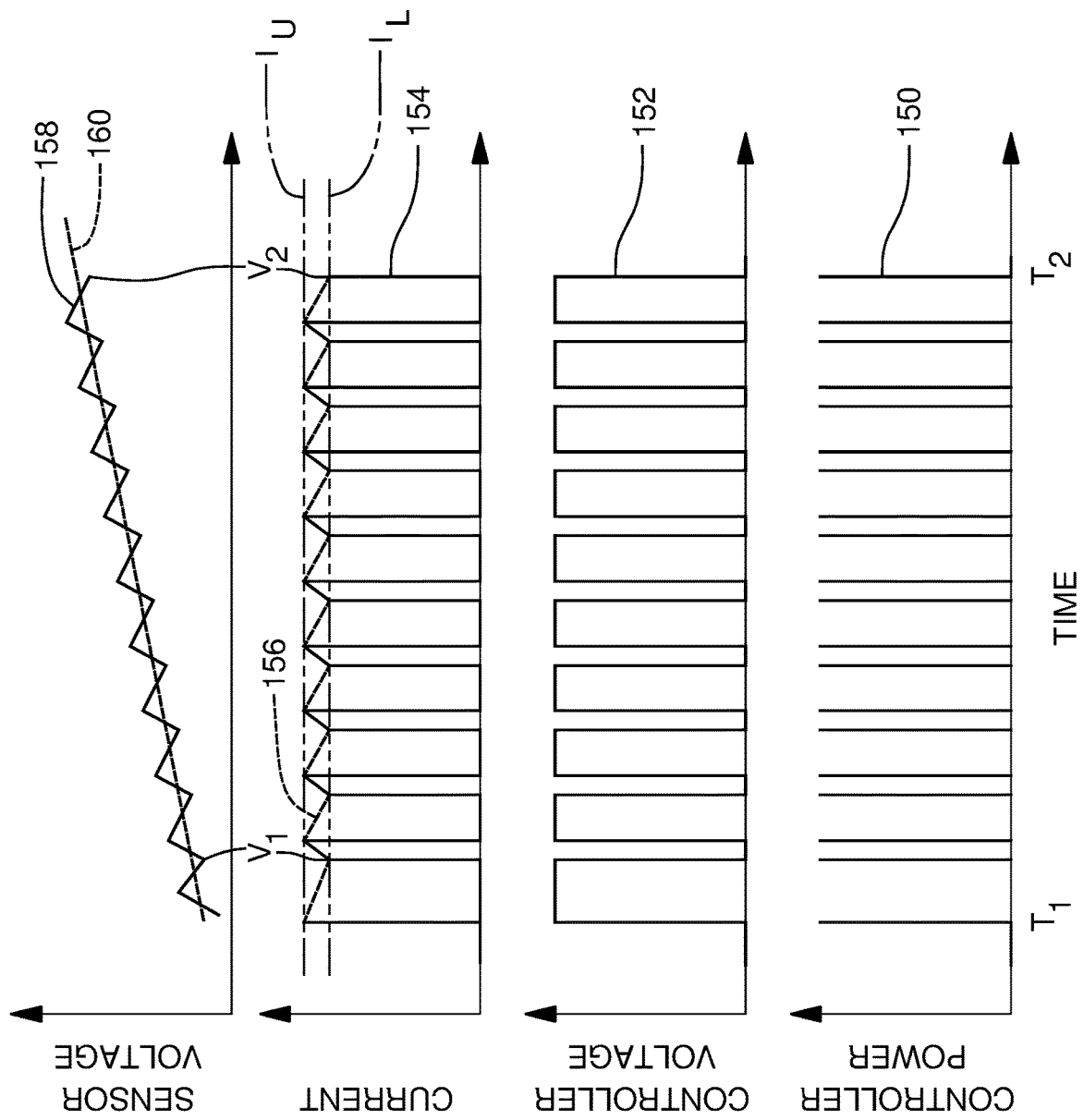
FIG. 4 is a series of four graphs illustrating power dissipated by a hysteretic controller of the fluid sensing system of FIG. 3, voltage output of the hysteretic controller, current supplied to a sensing element of the fluid sensing system of FIG. 3, and voltage across the sensing element.

In operation, and with additional reference to FIG. 4, when it is desired to measure the fluid level within container 114, hysteretic controller 122 commands switch 121 to close at time $T_1$, thereby allowing current to flow from battery 120 to inductor 136 and sensing element 112, indicated by the arrow labeled "SENSE CURRENT" in FIG. 3. By its nature, hysteretic controller 122 keeps switch 121 closed until current sensor 142 indicates that upper current threshold $I_U$ has been reached. When upper current threshold $I_U$ is reached, hysteretic controller 122 then commands switch 121 to open, thereby preventing current from flowing from battery 120 to inductor 136 and sensing element 112. With switch 121 now open, current will recirculate through recirculation path 140, including diode 138. As the current recirculates through inductor 136, sensing element 112, and diode 138, the current will decay in magnitude until lower current threshold $I_L$ is obtained. When current sensor 142 detects that lower threshold current $I_L$ is obtained, hysteretic controller 122 again commands switch 121 to close, thereby again allowing current to flow from battery 120 to inductor 136 and sensing element 112. Also when current sensor 142 detects that lower threshold current $I_L$ is obtained, hysteretic controller 122 provides a command signal 147 to electronic processor 134 in order for voltmeter 126 to measure a first voltage $V_1$ across sensing element 112 and communicate this measured voltage to electronic processor 134 where a first resistance of sensing element 112 is calculated in the same manner as described with respect to fluid sensing system 10. It is important to note that this voltage measurement is taken at lower current threshold $I_L$ which is a known current value, but alternatively, the voltage measurement may be taken at upper current threshold $I_U$ because this is also a known current value, however, using lower current threshold $I_L$ may be preferable to upper current threshold $I_U$ because the current decays much more slowly than it rises and is therefore more in control as a result of the current decay rate being limited by the voltage of diode 138 and the current rise rate being limited by the voltage of battery 120 which is much higher than the voltage of diode 138. This process of closing and opening switch 121 is repeated until time $T_2$ when the resistance of sensing element 112 reaches steady state and then hysteretic controller 122 provides command signal 147 to electronic processor 134 in order for voltmeter 126 to measure a second voltage $V_2$ across sensing element 112 and communicate this measured voltage to electronic processor 134 where this voltage measurement is indicated by reference character $V_2$ in FIG. 4. It is important to note that if $V_1$ is taken at lower current threshold $I_L$, then second voltage $V_2$ is also taken at lower current threshold $I_L$. Conversely, if first voltage $V_1$ is taken at upper current threshold $I_U$, then second voltage $V_2$ is also taken at upper current threshold $I_U$. Electronic processor 134 calculates a second resistance of sensing element 112 based on second voltage $V_2$ in the same manner as the first resistance based on first voltage $V_1$ and then the difference between the first resistance (based on first voltage $V_1$) and the second resistance (based on second voltage $V_2$) is calculated by electronic processor 134 and characterized to a fluid level, for example by using a stored lookup table which may be determined, by way of non-limiting example only, through empirical testing. This characterization is provided as output 135 which may be, by way of non-limiting example only, a visual output such as a gauge or warning lamp, an audible alert, an input to a computer process, or combinations of two or more of the foregoing. As should now be apparent, first voltage $V_1$ and second voltage $V_2$ are taken according to a state change of hysteretic controller 122, i.e. the voltage sampling is synchronized with obtaining lower current threshold $I_L$ if first voltage $V_1$ is taken at lower current threshold $I_L$ (or is synchronized with obtaining upper current threshold $I_U$ if second voltage $V_2$ is taken at upper current threshold $I_U$).

Figure 1:
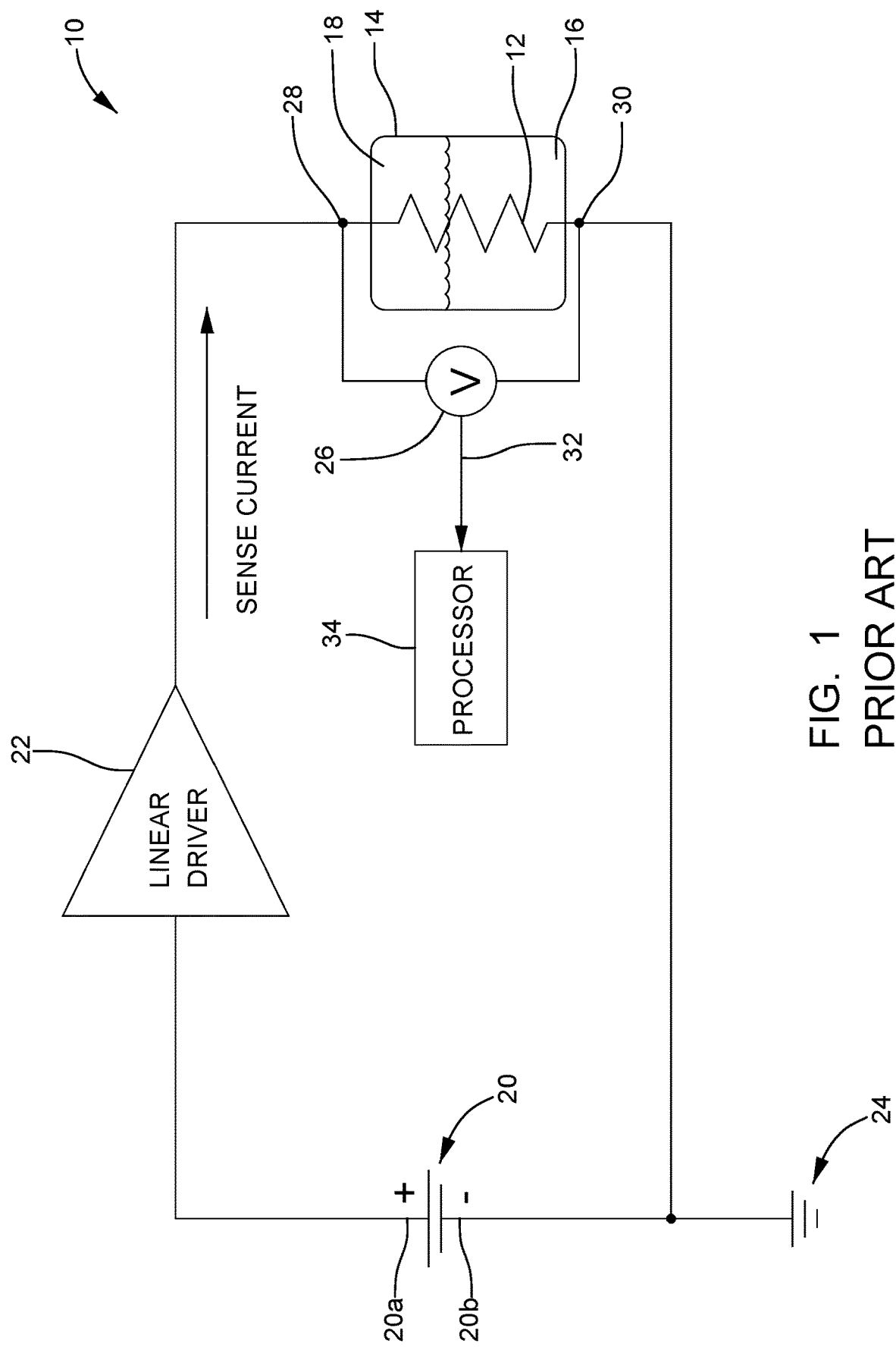
FIG. 1 is a schematic view of a known fluid sensing system.
Figure 2:
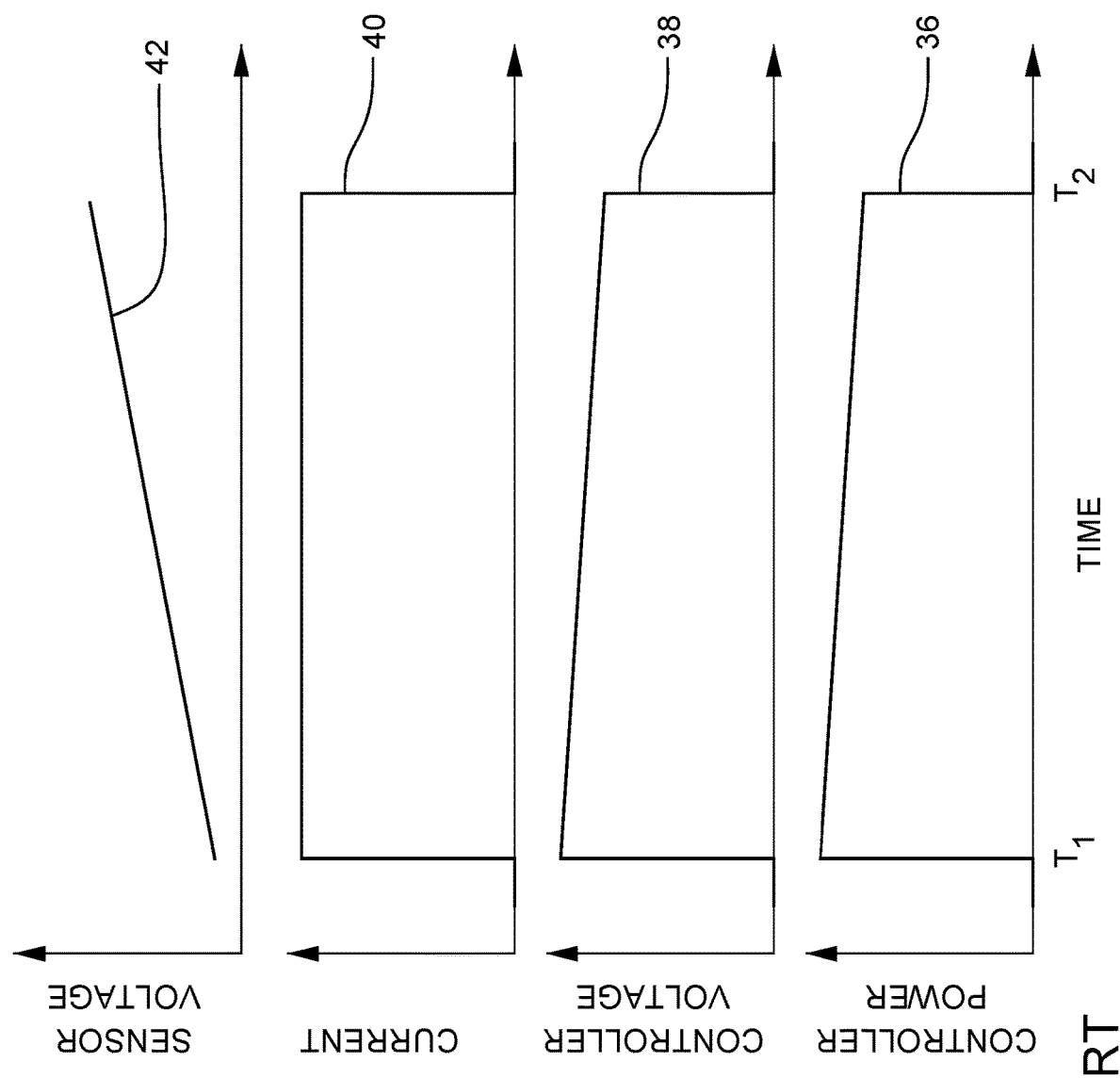
FIG. 2 is a series of four graphs for a time period of $T_1$ to $T_2$ illustrating power dissipated by a linear current supply of the fluid sensing system of FIG. 1, voltage output of the linear current supply, current supplied to a sensing element of the fluid sensing system of FIG. 1, and voltage across the sensing element.

FIG. 4 provides four graphs for the period of time from $T_1$ to $T_2$ which represents the predetermined time period needed for determining the fluid level in container 114 and for comparison purposes, is the same magnitude as $T_1$ to $T_2$ in the graphs of FIG. 2 which represent fluid sensing system 10. In FIG. 4, plot 150 represents the power dissipated by hysteretic controller 122, plot 152 represents the voltage of hysteretic controller 122, plot 154 (solid lines) represents the current supplied to sensing element 112 from battery 120, plot 156 (dashed lines) represents the current supplied to sensing element 112 through recirculation path 140, plot 158 (solid lines) represents the voltage across sensing element 112, and plot 160 (dashed lines) represents the average voltage across sensing element 112. As can be seen by plot 150, power is dissipated by hysteretic controller 122 only when switch 121 is switched from the open position to the closed position and when switch 121 is switched from the closed position to the open position. Also as can be seen by plots 154 and 156, the current supplied to sensing element 112 will rise and fall between lower current threshold $I_L$ and upper current threshold $I_U$ as a result of switch 121 being opened and closed where it is important to note that the current decay, i.e. from upper current threshold $I_U$ to lower current threshold $I_L$ represents the majority of the time, for example, 90% of $T_1$ to $T_2$ while the current rise, i.e. from lower current threshold $I_L$ to upper current threshold $I_U$ represents the minority of the time, for example, 10% of $T_1$ to $T_2$.

The power dissipated by fluid sensing system 110 is provided by the following equation:

$$P = Duty_{Rise}\left[R_{dsON}\left(\frac{I_U + I_L}{2}\right)^2\right] + Duty_{Decay}\left[V_{diode}\left(\frac{I_U + I_L}{2}\right)\right] + P_{switching\ loss}$$

where P is the power dissipated by fluid sensing system 110; $Duty_{Rise}$ is the duty cycle for is the current rise, i.e. switch 121 closed; $R_{dsON}$ is the resistance of switch 121 when closed; $I_U$ is the upper current threshold of hysteretic controller 122; $I_L$ is the lower current threshold of hysteretic controller 122; $Duty_{Decay}$ is the duty cycle for the current decay, i.e. switch 121 open; $V_{diode}$ is the voltage drop across diode 138; and $P_{switching\ loss}$ is power dissipated due to switching losses of switch 121. In one example, $Duty_{Rise}$ is 0.10 (10%); is $R_{dsON}$ is at most 0.25Ω, $I_U$ is 300 mA; $I_L$ is 200 m; $Duty_{Decay}$ is 0.90 (90%); $V_{diode}$ is 0.7V; and $P_{switching\ loss}$ is negligible. In this example, P is about 160 mW. Consequently, fluid sensing system 110 provides substantially less power dissipation compared to known fluid sensing system 10, i.e. 160 mW to provide 250 mA (average of 200 mA and 300 mA) to sensing element 112 compared to greater than 5 W to provide 250 mA to sensing element 12. This substantial decrease in power dissipation allows for cost savings and space savings since hysteretic controller 122 does not require heat sinking, power sense resistors, or precision amplifiers which are needed by linear current supply 22 due to its necessity to dissipate a substantially greater magnitude of power and due to its necessity to output a precise current.

While this invention has been described in terms of preferred embodiments thereof, it is not intended to be so limited, but rather only to the extent set forth in the claims that follow.

We claim:

1. A fluid sensing system for sensing a fluid depth or a fluid flow of a fluid, said fluid sensing system comprising:
    a sensing element configured to be disposed in said fluid, said sensing element having a positive temperature coefficient of resistance, and said sensing element including a sensing element electric input and a sensing element electric output;
    a switch including a switch electric input and a switch electric output, said switch being switchable between an open position which prevents electric current from passing from said switch electric input to said switch electric output and a closed position which permits electric current to pass from said switch electric input to said switch electric output;
    an inductor connected electrically in series between said switch electric output and said sensing element, said inductor including an inductor electric input and an inductor electric output;
    a diode connected electrically in series between said sensing element and said inductor, said diode including a diode electric input and a diode electric output such that said diode electric output is electrically connected between said switch electric output and said inductor electric input;
    a hysteretic controller configured to change said switch from said open position to said closed position when electric current passing to said sensing element falls to a lower current threshold and configured to change said switch from said closed position to said open position when electric current passing to said sensing element rises to an upper current threshold; and
    a means for measuring voltage across said sensing element.

2. A fluid sensing system as in claim 1, wherein said diode electric input is connected between said sensing element and ground at a first recirculation path junction and said diode electric output is connected between said switch electric output and said inductor electric input at a second recirculation path junction, said fluid sensing system further comprising a current sensor connected electrically in series between said second recirculation path junction and said sensing element electric input, said current sensor being configured to provide said hysteretic controller with a signal indicative of current passing to said sensing element.

3. A fluid sensing system as in claim 2, wherein said current sensor is connected electrically in series between said second recirculation path junction and said inductor electric input.

4. A fluid sensing system as in claim 2, wherein said hysteretic controller is configured to close said switch when said current sensor senses that current to said sensing element falls to said lower current threshold and is configured to open said switch when said current sensor senses that current to said sensing element rises to said upper current threshold.

5. A fluid sensing system as in claim 1, wherein said sensing element is configured to be disposed in a container which contains said fluid such that an extent to which said sensing element is submersed in said fluid is dependent upon said fluid depth of said fluid in said container.

6. A fluid sensing system as in claim 1, wherein said switch is a MOSFET.

7. A fluid sensing system as in claim 1, further comprising a battery having a positive terminal and a negative terminal, wherein said switch is connected electrically in series between said positive terminal and said inductor.

8. A fluid sensing system as in claim 1, wherein said hysteretic controller is further configured to send a command signal to an electronic processor to obtain a voltage across said sensing element, said command signal being synchronized with electric current passing to said sensing element reaching said lower current threshold or reaching said upper current threshold.

9. A method for sensing a fluid depth or a fluid flow of a fluid with a fluid sensing system which includes a sensing element configured to be disposed in said fluid, said sensing element having a positive temperature coefficient of resistance, and said sensing element including a sensing element electric input and a sensing element electric output; a switch including a switch electric input and a switch electric output, said switch being switchable between an open position which prevents electric current from passing from said switch electric input to said switch electric output and a closed position which permits electric current to pass from said switch electric input to said switch electric output; an inductor connected electrically in series between said switch electric output and said sensing element, said inductor including an inductor electric input and inductor electric output; a diode connected electrically in series between said sensing element and said inductor, said diode including a diode electric input and a diode electric output such that said diode electric output is electrically connected between said switch electric output and said inductor electric input; a hysteretic controller configured change said switch between said open position and said closed position; and a means for measuring voltage across said sensing element, said method comprising:

i) using said hysteretic controller to close said switch which allows an electric current to flow to said inductor and said sensing element;

ii)) after step i), using said hysteretic controller to open said switch when said electric current reaches a upper current threshold;

iii) after step ii), recirculating said electric current through said diode to said inductor and said sensing element while said switch is open;

iv) after step iii), using said hysteretic controller to close said switch when said step of recirculating said electric current causes said electric current to decay to a lower current threshold;

v) repeating step i)-iv) for a predetermined time;

vi) prior to step v), using said means for measuring voltage across said sensing element to measure a first voltage across said sensing element when said electric current is one of said lower current threshold and said upper current threshold;

vii) after step v) and after step vi), using said means for measuring voltage across said sensing element to measure a second voltage across said sensing element when said electric current is said one of said lower current threshold and said upper current threshold; and viii) using said first voltage and said second voltage to characterize said fluid depth or said fluid flow.

10. A method as in claim 9, wherein said first voltage and said second voltage are communicated to an electronic processor which calculates a first resistance of said sensing element using said first voltage and said one of said lower current threshold and said upper current threshold and which calculates a second resistance of said sensing element using said second voltage and said one of said lower current threshold and said upper current threshold.

11. A method as in claim 10, wherein said first resistance and said second resistance are used to characterize said fluid depth or said fluid flow.

12. A method as in claim 10, wherein said hysteretic controller provides a command signal to said electronic processor to cause step vi) and step vii) to be carried out.

\* \* \* \* \*